US008815105B2

(12) United States Patent
Dobisz et al.

(10) Patent No.: US 8,815,105 B2
(45) Date of Patent: Aug. 26, 2014

(54) METHOD USING BLOCK COPOLYMERS FOR MAKING A MASTER MOLD FOR NANOIMPRINTING PATTERNED MAGNETIC RECORDING DISKS WITH CHEVRON SERVO PATTERNS

(75) Inventors: Elizabeth Ann Dobisz, San Jose, CA (US); Ricardo Ruiz, Santa Clara, CA (US); Guoliang Liu, Madison, WI (US); Paul Franklin Nealey, Madison, WI (US)

(73) Assignee: HGST Netherlands B.V., Amsterdam (NL)

( * ) Notice: Subject to any disclaimer, the term of this patent is extended or adjusted under 35 U.S.C. 154(b) by 495 days.

(21) Appl. No.: 13/036,346

(22) Filed: Feb. 28, 2011

(65) Prior Publication Data

US 2012/0217220 A1 Aug. 30, 2012

(51) Int. Cl.
*B28B 7/38* (2006.01)
*B05D 3/10* (2006.01)
*B05D 5/00* (2006.01)
*G03F 7/00* (2006.01)
*G11B 5/855* (2006.01)
*B81C 1/00* (2006.01)

(52) U.S. Cl.
CPC .............. *G03F 7/0002* (2013.01); *G11B 5/855* (2013.01); *B81C 1/0046* (2013.01)
USPC ................... 216/41; 216/22; 216/42; 216/11; 427/133

(58) Field of Classification Search
CPC ...... G03F 7/0002; G11B 5/855; B81C 1/0046
USPC ......................... 216/22, 41, 42, 11
See application file for complete search history.

(56) References Cited

U.S. PATENT DOCUMENTS

| 6,704,156 B1 | 3/2004 | Baker et al. |
| 6,746,825 B2 | 6/2004 | Nealey et al. |
| 2006/0134556 A1 | 6/2006 | Nealey et al. |

(Continued)

OTHER PUBLICATIONS

Kamata, et al., "Fabrication of Ridge-and-Groove Servo Pattern Consisting of Self-Assembled Dots for 2.5 Tb/in2 Bit Patterned Media", IEEE Transactions on Magnetics. vol. 47, No. 1, Jan. 2011, pp. 51-54.

(Continued)

*Primary Examiner* — Nadine Norton
*Assistant Examiner* — Mahmoud Dahimene
(74) *Attorney, Agent, or Firm* — Thomas R. Berthold

(57) ABSTRACT

A method for making a master mold used to nanoimprint patterned magnetic recording disks that have chevron servo patterns with minimal defects uses directed self-assembly of block copolymers. A pattern of chemically modified polymer brush material is formed on the master mold substrate. The pattern includes sets of slanted stripes and interface strips between the sets of slanted stripes. A block copolymer material is deposited on the pattern, which results in directed self-assembly of the block copolymer as lamellae perpendicular to the substrate that are formed into alternating slanted stripes of alternating first and second components of the block copolymer. This component also forms on the interface strips, but as a lamella parallel to the substrate. One of the components is then removed, leaving the remaining component as a grid that acts as a mask for etching the substrate to form the master mold. The disks nanoimprinted by the master mold have reduced defective areas in the transition regions of the chevron servo patterns.

20 Claims, 10 Drawing Sheets

(56) References Cited

U.S. PATENT DOCUMENTS

| | | | |
|---|---|---|---|
| 2009/0308837 A1 | 12/2009 | Albrecht et al. | |
| 2009/0311363 A1* | 12/2009 | Dobisz et al. | 425/470 |
| 2010/0165512 A1 | 7/2010 | Albrecht et al. | |
| 2011/0096436 A1* | 4/2011 | Albrecht et al. | 360/135 |

OTHER PUBLICATIONS

Liu, et al., "Integration of Density Multiplication in the Formation of Device-Oriented Structures by Directed Assembly of Block Copolymer—Homopolymer Blends", Adv. Funct. Mater. 2010, 20, 1251-1257.

Stoykovich, et al., "Directed Self-Assembly of Block Copolymers for Nanolithography: Fabrication of Isolated Features and Essential Integrated Circuit Geometries", ASC NANO, vol. 1, No. 3, 2007, pp. 168-175.

Stoykovich, et al., "Remediation of Line Edge Roughness in Chemical Nanopatterns by the Directed Assembly of Overlying Block Copolymer Films". Macromolecules 2010, 43, (5), 2334-2342.

* cited by examiner

METHOD USING BLOCK COPOLYMERS FOR MAKING A MASTER MOLD FOR NANOIMPRINTING PATTERNED MAGNETIC RECORDING DISKS WITH CHEVRON SERVO PATTERNS

BACKGROUND OF THE INVENTION

1. Field of the Invention

This invention relates generally to patterned-media magnetic recording disks with patterned servo sectors, and to a method for making a master mold for nanoimprinting the patterned-media disks.

2. Description of the Related Art

Magnetic recording hard disk drives with patterned magnetic recording media have been proposed to increase data density. In patterned media, the magnetic recording layer on the disk is patterned into small isolated data islands arranged in concentric data tracks. To produce the required magnetic isolation of the patterned data islands, the magnetic moment of spaces between the islands must be destroyed or substantially reduced to render these spaces essentially nonmagnetic. In one type of patterned media, the data islands are elevated regions or pillars that extend above "trenches" and magnetic material covers both the pillars and the trenches, with the magnetic material in the trenches being rendered nonmagnetic, typically by "poisoning" with a material like silicon (Si). In another type of patterned media, the magnetic material is deposited first on a flat disk substrate. The magnetic data islands are then formed by milling, etching or ion-bombarding of the area surrounding the data islands.

Like conventional non-patterned or continuous-media disks, patterned-media disks are also required to have non-data servo regions that are used for read/write head positioning. The servo regions in the pre-etched type of patterned-media disks with elevated spaced-apart data pillars may also be patterned and thus contain elevated nondata servo islands or pillars that are separated by trenches. The servo pillars are typically "servowritten" or pre-magnetized during the manufacturing process and are not intended to be rewritten during normal operation of the disk drive. The proposed method for servowriting this type of disk is to DC "erase" the disk during manufacturing with a large magnet, leaving all of the servo pillars magnetized in the same direction. Thus for a patterned-media perpendicular magnetic recording disk, all of the servo pillars will have the same magnetization direction, i.e., either "into" or "out of" the surface of the disk. However, unlike the pattern of data pillars which are generally a periodic pattern of lines or dots, the servo pillars typically have different shapes and do not form a periodic pattern, but a generally arbitrary pattern. One such servo pattern is a chevron pattern of slanted or non-radial stripes that extend across the data tracks.

One proposed method for fabricating patterned-media disks is by nanoimprinting with a template or mold, sometimes also called a "stamper", that has a topographic surface pattern. In this method the magnetic recording disk substrate with a polymer film on its surface is pressed against the mold. The polymer film receives the reverse image of the mold pattern and then becomes a mask for subsequent etching of the disk substrate to form the pillars on the disk. In one type of patterned media, the magnetic layer and other layers needed for the magnetic recording disk are then deposited onto the etched disk substrate and the tops of the pillars to form the patterned-media disk. In another type of patterned media, the magnetic layers and other layers needed for the magnetic recording disk are first deposited on the flat disk substrate. The polymer film used with nanoimprinting is then pressed on top of these layers. The polymer film receives the reverse image of the mold pattern and then becomes a mask for subsequent milling, etching or ion-bombarding the underlying layers. The mold may be a master mold for directly imprinting the disks. However, the more likely approach is to fabricate a master mold with a pattern of pillars corresponding to the pattern of pillars desired for the disks and to use this master mold to fabricate replica molds. The replica molds will thus have a pattern of recesses or holes corresponding to the pattern of pillars on the master mold. The replica molds are then used to directly imprint the disks. Nanoimprinting of patterned media is described by Bandic et al., "Patterned magnetic media: impact of nanoscale patterning on hard disk drives", *Solid State Technology* S7+*Suppl. S*, September 2006; and by Terris et al., "TOPICAL REVIEW: Nanofabricated and self-assembled magnetic structures as data storage media", *J. Phys. D: Appl. Phys.* 38 (2005) R199-R222.

The making of the master template or mold is a difficult and challenging process. The use of electron beam (e-beam) lithography using a Gaussian beam rotary-stage e-beam writer is viewed as a possible method to make a master mold capable of nanoimprinting patterned-media disks, but this method limits the areal bit density of patterned-media disks to about 500 Gbit/in$^2$. Directed self-assembly of block copolymers has also been proposed for making the master mold and is believed capable of achieving areal bit densities of greater than 1 Terabit/in$^2$. Pending application Ser. No. 12/141,062, filed Jun. 17, 2008 and assigned to the same assignee as this application, describes the use of directed self-assembly of block copolymers to make a master mold that allows the circumferential density of the subsequently nanoimprinted data pillars to be at least doubled from what could be achieved with a mold fabricated with just e-beam lithography. Pending application Ser. No. 12/604,333, filed Oct. 22, 2009 and assigned to the same assignee as this application, describes the use of directed self-assembly of two different block copolymers to make a master mold that has a chevron servo pattern. However, the interface regions between the circumferentially-spaced sets of stripes of the chevron pattern may exhibit defects due to the sharp transitions of the slanted stripes.

What is needed is a method using directed self-assembly of block copolymers to make a master mold for nanoimprinting patterned-media magnetic recording disks that have servo patterns without defective areas.

SUMMARY OF THE INVENTION

The invention relates to a method using directed self-assembly of block copolymers for making a master mold used to nanoimprint patterned-media magnetic recording disks that have chevron servo patterns with minimal defects. Conventional or e-beam lithography is used to form a pattern of chemically modified polymer brush material on the master mold substrate that will result in the desired pattern of concentric rings for the data tracks and chevron pattern of slanted stripes for the servo sectors when the disks are nanoimprinted. The pattern includes interface strips between the sets of slanted stripes and at the transition regions between the concentric rings and the slanted stripes. The patterned interface strips significantly reduce defects and control the extent of the disruptive areas in the chevron servo patterns of the resulting nanoimprinted disks. A first block copolymer material is then deposited on the pattern. One of the components of the first block copolymer has an affinity for the chemically-modified polymer brush material, which results in directed self-assembly of the first block copolymer as lamellae perpendicular to the substrate that are formed into alternating concentric rings and alternating slanted stripes of alternating first and second components of the first block copolymer. This component also forms on the chemically-modified polymer brush material on the interface strips, but as a lamella parallel to the substrate.

Directed self-assembly of a second block copolymer is then used to form a pattern of radial lines over the concentric rings and slanted stripes. One of the components of the first block copolymer and one of the components of the second copolymer are removed, leaving a grid of non-removed concentric rings, slanted stripes, radial lines and interface strips. This grid is used as an etch mask to etch the underlying substrate. Because one of the components of the first block copolymer has formed as a lamella parallel to the substrate on the interface strips of chemically-modified polymer brush material, the resulting grid has significantly reduced defects in the regions between the sets of slanted stripes and in the transition regions between the concentric rings and slanted stripes. After etching and removal of the grid, the master mold has a pattern of either pillars or holes, depending on the method used. The pillars or holes are arranged in circular rings in the portions of the mold that will be used to form the data islands in the nanoimprinted disks. The pillars or holes are arranged in slanted stripes in the portions of the mold that will be used to form the chevron servo sectors in the nanoimprinted disks. The concentric rings are used to define the radial width of the data islands formed by the master mold and the slanted stripes are used to define the cross-stripe width of the stripes of the chevron servo pattern formed by the master mold. The disks nanoimprinted by the master mold will have significantly reduced defective areas in the transition regions of the chevron servo patterns.

For a fuller understanding of the nature and advantages of the present invention, reference should be made to the following detailed description taken together with the accompanying figures.

DETAILED DESCRIPTION OF THE INVENTION

Figure 1:
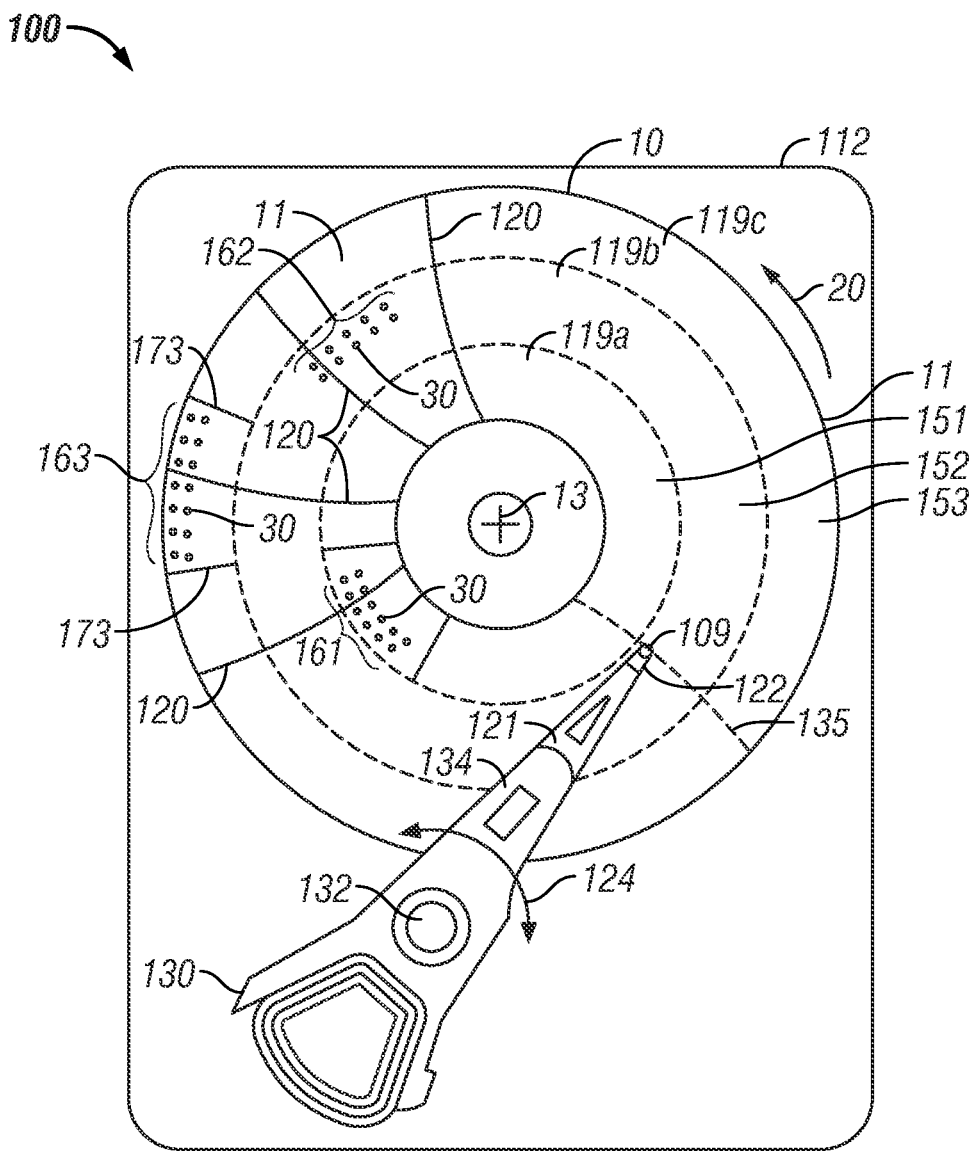
FIG. 1 is a top view of a disk drive with a patterned-media type of magnetic recording disk according to the invention.

FIG. 1 is a top view of a patterned-media disk drive 100 like that to which the present invention relates. The drive 100 has a housing or base 112 that supports an actuator 130 and a spindle motor (not shown) for rotating the patterned magnetic recording disk 10 about its center 13. The actuator 130 may be a voice coil motor (VCM) rotary actuator that has a rigid arm 134 and rotates about pivot 132 as shown by arrow 124. A head-suspension assembly includes a suspension 121 that has one end attached to the end of actuator arm 134 and a head carrier, such as an air-bearing slider 122, attached to the other end of suspension 121. The suspension 121 permits the head carrier 122 to be maintained very close to the surface of disk 10. The slider 122 supports the read/write or recording head 109. The recording head 109 is typically a combination of an inductive write head with a magnetoresistive read head (also called a read/write head) and is located on the trailing end or end face of the slider 122. Only one disk surface with associated slider and recording head is shown in FIG. 1, but there are typically multiple disks stacked on a hub that is rotated by a spindle motor, with a separate slider and recording head associated with each surface of each disk.

The patterned magnetic recording disk 10 includes a disk substrate 11 and discrete data islands 30 of magnetizable material on the substrate 11. The data islands 30 function as discrete magnetic bits for the storage of data. Each discrete data island 30 is a magnetized island separated from other islands by nonmagnetic regions or spaces. The term "nonmagnetic" means that the spaces between the data islands are formed of a nonferromagnetic material, such as a dielectric, or a material that has no substantial remanent moment in the absence of an applied magnetic field, or a magnetic material in a groove or trench recessed far enough below the islands to not adversely affect reading or writing. The nonmagnetic spaces between the data islands may also be the absence of magnetic material, such as grooves or troughs in the magnetic recording layer or disk substrate.

The data islands 30 are arranged in radially-spaced generally circular tracks, with the tracks being grouped into annular bands or zones 151, 152, 153. Within each track, the data islands 30 are typically arranged in fixed-byte-length data sectors (e.g., 512 bytes plus additional bytes for error correction coding (ECC) and data sector header). The number of data sectors is different in each zone. The grouping of the data tracks into annular zones permits zoned recording, wherein the angular spacing of the data islands, and thus the data rate, is different in each zone. In FIG. 1, three zones 151, 152, 153 are shown, with only portions of representative concentric data tracks, 161, 162, 163, being shown for each respective zone. While only three zones are depicted in FIG. 1, modern disk drives typically have about 20 zones. In each zone there are also generally radially-directed synchronization (sync) marks, like typical marks 173 in zone 153. Each sync mark 173 may be a plurality of circumferentially-spaced marks, with the angular spacing being different in each zone, that are detected by the read head to enable the write head to be synchronized with the specific spacing of the data islands in that zone. The sync marks may be located in the sector headers for the data sectors. The physical location where data is to be written or read is identified by a head number, track number (also called "cylinder" number when there are multiple disks) and data sector number.

As the disk 10 rotates about its center 13 in the direction of arrow 20, the movement of actuator 130 allows the read/write head 109 on the trailing end of head carrier 122 to access different data tracks and zones on disk 10. Because the actuator 130 is a rotary actuator that pivots about pivot 132, the path of the read/write head 109 across the disk 10 is not a perfect radius but instead an arcuate line 135.

Each data track also includes a plurality of circumferentially or angularly-spaced servo sectors 120 that contain positioning information detectable by the read head for moving the head 109 to the desired data tracks and maintaining the head 109 on the data tracks. The servo sectors in each track are aligned circumferentially with the servo sectors in the other tracks so that they extend across the tracks in a generally radial direction, as represented by radially-directed servo sectors 120. The servo sectors 120 have an arcuate shape that generally replicates the arcuate path 135 of the head 109. The servo sectors 120 are nondata regions on the disk that are magnetized once, typically during manufacturing or formatting of the disk, and are not intended to be erased during normal operation of the disk drive. While the sync marks (like sync marks 173) may be located in the sector headers for the data sectors, as an alternative they may be located in the servo sectors 120.

Figure 2:
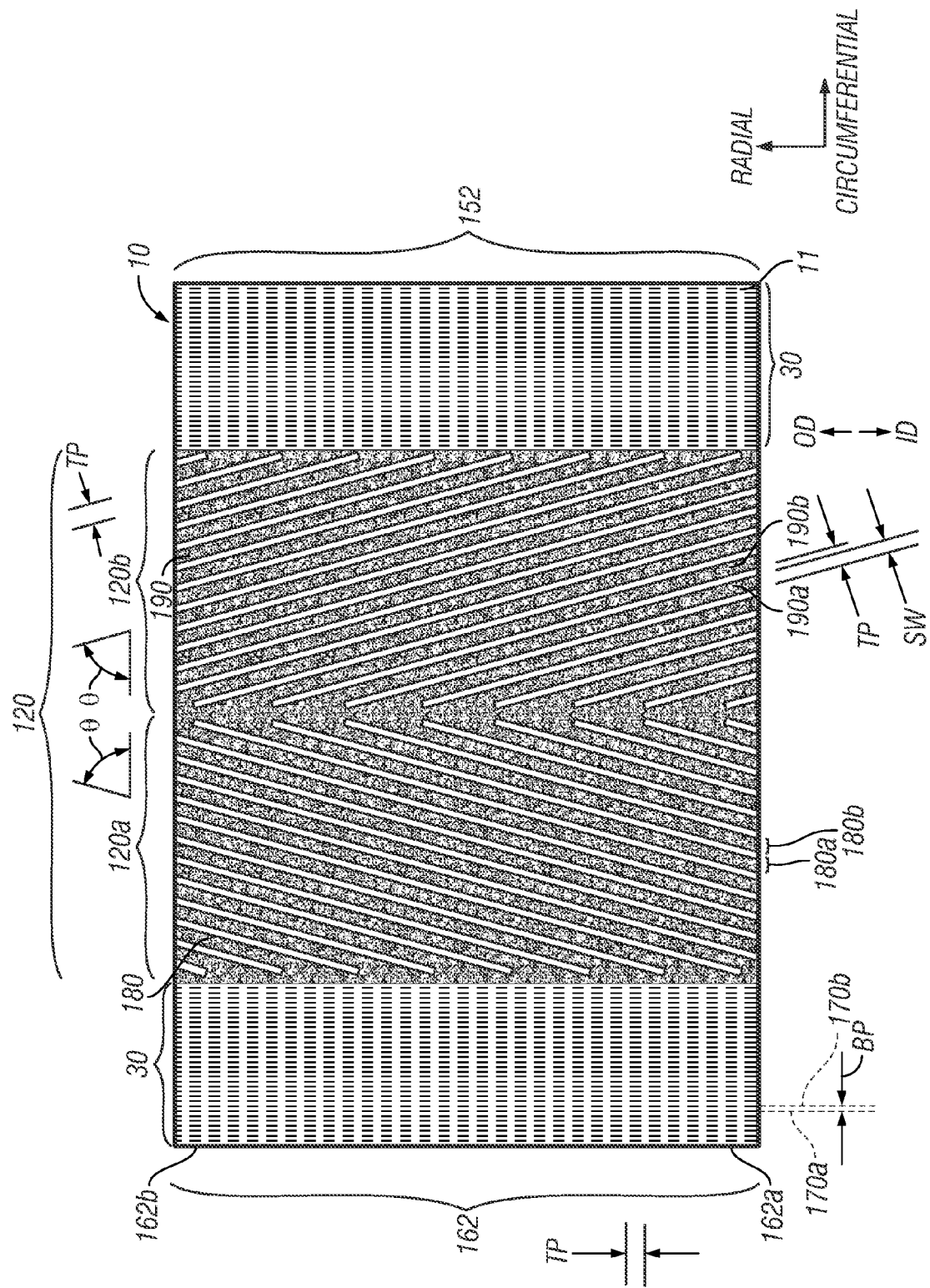
FIG. 2 is a top view of an enlarged portion of the patterned-media magnetic recording disk according to the invention showing the arrangement of the patterned data tracks and patterned servo sector in one of the zones on the surface of the disk substrate.

FIG. 2 is a top view of an enlarged portion of the patterned-media perpendicular magnetic recording disk 10 nanoimprinted by a master mold made according to the invention. The portion is a portion of zone 152 with data tracks 162 having data islands 30 and a servo sector 120 extending generally radially across the data tracks 162. The data islands 30 are spaced apart by a nearly fixed circumferential or along-the-track spacing or bit pitch (BP). The data tracks 162 are spaced apart by a nearly fixed radial or cross-track spacing or track pitch (TP). In patterned media, the bit-aspect-ratio (BAR) of the pattern of discrete data islands 30 arranged in concentric tracks 162 is the ratio of TP to BP. This is the same as the ratio of linear island density in bits per inch (BPI) in the along-the-track direction to the track density in tracks per inch (TPI) in the cross-track direction. While the islands 30 are shown as being rectangularly shaped, they may have other shapes, such as circular or generally rectangularly or generally elliptical. The islands 30 are also arranged into generally radial lines, as shown by typical radial lines 170a, 170b, that extend from disk center 13 (FIG. 1). Because FIG. 2 shows only a small portion of the disk substrate 11 with only a small number of data tracks 162, the pattern of islands 30 appears to be two sets of perpendicular lines. However, the data tracks 162 are concentric rings centered about the center 13 of disk 10 and the lines 170a, 170b are not parallel lines, but radial lines extending from the center 13 of disk 10. The disk is divided into annular concentric zones where in each zone, the data islands 30s maintain a constant angular spacing. Thus, within one zone, the angular spacing between adjacent islands as measured from the center 13 of the disk for adjacent islands in lines 170a, 17b in a radially inner track towards the inside diameter (ID) (like track 162a) is the same as the angular spacing for adjacent islands in lines 170a, 170b in a radially outer track towards the outside diameter (OD) (like track 162b). The generally radial lines 170a, 170b may be perfectly straight radial lines but are preferably arcs or arcuate-shaped radial lines that replicate the arcuate path 135 (FIG. 1) of the read/write head on the rotary actuator. Such arcuate-shaped radial lines provide a constant phase position of the data islands as the head sweeps across the data tracks. There is a very small radial offset between the read head and the write head, so that the synchronization field (like field 173 in zone 163 in FIG. 1) used for writing on a track is actually read from a different track. If the islands between the two tracks are in phase, which is the case if the radial lines are arcuate-shaped, then writing is greatly simplified.

The patterned-media disk 10 also includes patterned servo sectors 120. In the patterned-media disk according to the invention as shown in FIG. 2, each of the servo sectors 120 includes a V-shaped pattern or inverted V-shaped pattern (sometimes called a chevron pattern) of circumferentially adjacent fields 120a, 120b of parallel non-radial magnetized stripes 180, 190, respectively. The stripes 180 in field 120a are slanted in one direction (to the right in FIG. 2) relative to data tracks 162 at an acute angle θ, and the stripes 190 in field 120b are slanted in a different direction (to the left in FIG. 2) relative to data tracks 162 at an acute angle, preferably the same angle θ. The stripes 180, 190 are thus also slanted relative to a radial line by an acute angle (90−θ). The stripes 180, 190 are preferably magnetized in the same direction, i.e., in a direction either perpendicularly into or out of the plane of the disk substrate 11, preferably by being DC-magnetized after the disk has been fabricated.

A chevron servo pattern is well-known for conventional disk drives with conventional non-patterned media. The readback signal registers a sinusoid as the read head passes over each of the two fields of the chevron pattern. If the radial position of the head varies, the phase of one sinusoid will be advanced while the phase of the other sinusoid will be retarded. Thus the radial position of the head can be estimated by measuring the phase difference between the two sinusoidal readback signals. Single-frequency Fast Fourier Transform (FFT) methods can generate the necessary phase estimates and are near-maximum-likelihood estimators in the presence of white noise and if the signals are high density. More complex estimators based on non-sinusoidal inputs or more general noise phenomenon can achieve somewhat better performance. The measured phase difference from a chevron servo pattern yields only the fractional part of the head radial position, i.e., the fractional part of one complete radial span of the chevron pattern, because the phase measurement will be the same result for two head positions differing by an integer multiple of the chevron pattern period. Thus in the conventional servo system with a chevron servo pattern, the integer part of the radial head position, i.e. the actual track number, is determined by demodulation of a gray-coded track identification (ID), which is typically located near the start of a servo sector before the chevron pattern.

In a servo system for patterned media, like the one shown in this invention, the stripes 180, 190 in the chevron servo fields 120a, 120b are continuous stripes of magnetized material, which will generate a conventional readback signal like that from the well-known chevron servo pattern. However, the stripes 180, 190 may alternatively be comprised of discrete magnetized segments circumferentially spaced with same spacing BP as the data islands, as described in the previously cited application Ser. No. 12/604,333. In such an alternative approach, the readback signal would respond to the magnetized segments separated in the circumferential direction by, and at the same time would also be modulated by the spacing and acute angle of the non-radial stripes 180, 190. The result would be a readback signal whose amplitude is modulated by an "envelope" that is similar to the sinusoidal signal from a conventional chevron servo pattern as explained above.

Patterned-media perpendicular magnetic recording disks like that shown in FIG. 2 have the magnetization directions in the magnetizable recording material (data islands 30 and non-radial stripes 180, 190) perpendicular to or out-of-the-plane of the recording layer. To produce the required magnetic isolation of the patterned data islands and stripes, the magnetic moment of the regions between the islands and stripes must be destroyed or substantially reduced to render these spaces essentially nonmagnetic. Patterned media may be fabricated by any of several known techniques. In one type of patterned media, the data islands are elevated, spaced-apart pillars that extend above the disk substrate surface to define troughs or trenches on the substrate surface between the pillars. This type of patterned media is shown in the sectional view in FIG. 3A wherein only a few data islands 30 are depicted. In this type of patterned media the substrate 11 with a pre-etched pattern of pillars 31 and regions or trenches 32 between the pillars can be produced with relatively low-cost, high volume nanoimprinting process using a master template or mold. The magnetic recording layer material is then deposited over the entire surface of the pre-etched substrate to cover both the ends of the pillars 31 and the trenches between the pillars 31, resulting in the data islands 30 of magnetic recording layer material and trenches 32 of magnetic recording layer material. The trenches 32 of recording layer material may be spaced far enough from the read/write head to not adversely affect reading or writing to the recording layer material in islands 30, or the trenches may be rendered nonmagnetic by "poisoning" with a material like Si. This type of patterned media is described by Moritz et al., "Patterned Media Made From Pre-Etched Wafers: A Promising Route Toward Ultrahigh-Density Magnetic Recording", *IEEE Transactions on Magnetics*, Vol. 38, No. 4, July 2002, pp. 1731-1736.

Figure 3A:
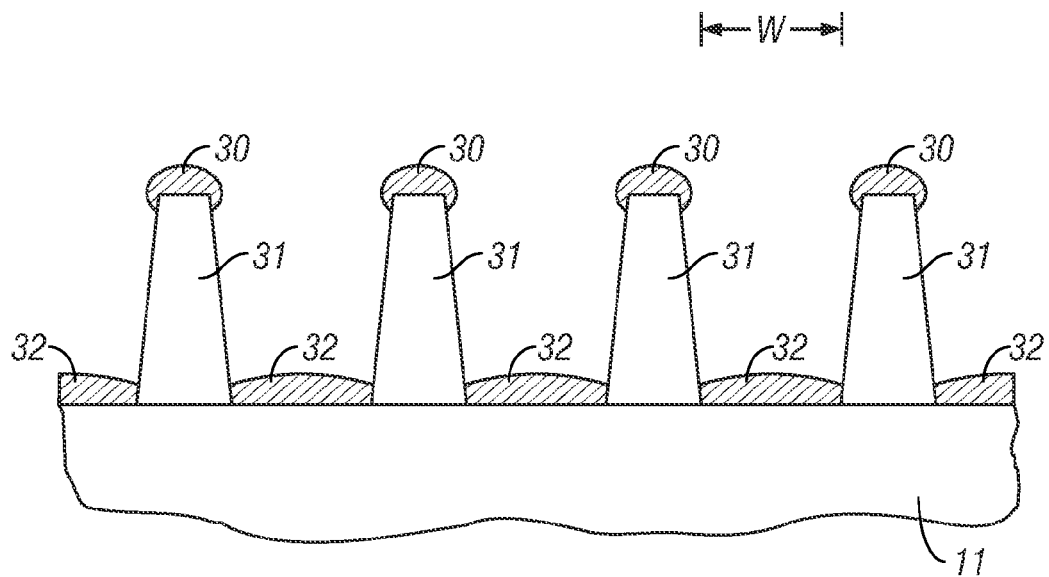
FIG. 3A is a side sectional view of a portion of the patterned-media disk showing the data islands as elevated, spaced-apart pillars that extend above the disk substrate surface with trenches between the pillars.
Figure 3B:
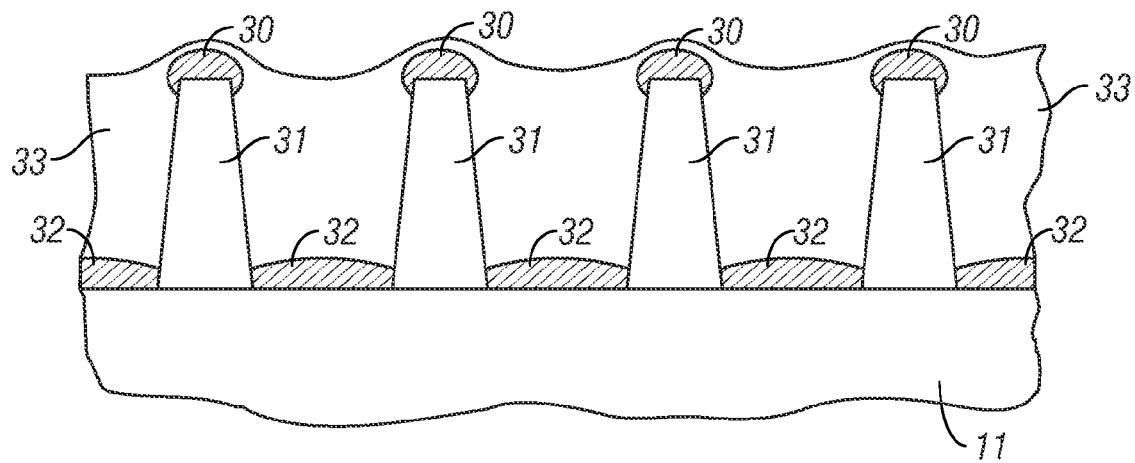
FIG. 3B is a side sectional view of the portion of the disk of FIG. 3A after planarization.

FIG. 3B shows the patterned-media disk of FIG. 3A after planarization with a planarization layer 33. Layer 33 may be a cured functionalized perfluorinated polyether (PFPE) polymer. The functionalized-PFPE is applied by dipping the disk into a solution of the functionalized-PFPE in a suitable solvent and then evaporating the solvent. One type of functionalized-PFPE is Fomblin® Z type with acrylate functional end groups, like that described in the U.S. Pat. No. 6,680,079 B2, that can be cross-linked via exposure to ultraviolet (UV) radiation.

In this invention the features that define the parallel non-radial stripes 180, 190 in the master template for the servo sector 120 may be formed in the same fabrication step as the data tracks 162. Referring again to FIG. 2, the stripes 180, 190 may have a stripe spacing or pitch in a direction perpendicular to the stripes that is substantially the same as the data track pitch TP, i.e., the stripe pitch is equal to TP+/−5% TP. Also, as shown by stripes 190a, 190b, each stripe has a stripe width (SW) that is substantially equal to the radial width of the data islands.

Fabrication of the non-radial stripes 180, 190 and the data tracks 162 in the same step also provides for very precise spatial registration of the servo pattern with the data tracks. The servo pattern of stripes with stripe pitch TP provides for much better signal-to-noise ratio (SNR) than a servo pattern with marks having a pitch equal to the BP. This is because DC-magnetized marks (all islands having the same orientation of magnetization) have a lower SNR than islands of alternating magnetization for a given read head. The SNR of DC-magnetized servo signals can be improved then by using a longer pitch of the servo stripes (such as TP).

As shown in FIG. 2, the chevron pattern of stripes 180, 190 repeats every four data tracks in the radial direction. Thus, the chevron pattern creates a servo position signal that is periodic every four tracks. A different radial periodicity can be chosen by changing the slope (the angle θ) of the stripes 180, 190. The radial periodicity of the chevron pattern does not need to be an integer multiple of the data tracks so long as it is a known mathematical relationship that describes the registration of the chevron pattern to the data tracks. Preferably the radial periodicity of the chevron pattern is between about 2 to 10 data tracks.

Only the fractional part of the head radial position within the radial span of one chevron pattern (four data tracks in the example of FIG. 2) is capable of being determined from the chevron pattern of stripes 180, 190. As in the conventional servo systems with chevron patterns, higher order bits of the track numbers (track IDs) are written in a separate servo writing step to a region outside of the chevron patterns, typically immediately preceding the chevron patterns in time as the read head reads the servo sector headers.

The disk shown in FIG. 2 is fabricated by nanoimprinting from a master template or mold. The making of the master template or mold to achieve an ultrahigh density patterned-media disk is a difficult and challenging process. The use of electron beam (e-beam) lithography using a Gaussian beam rotary-stage e-beam writer is viewed as a possible method to make the master mold. However, to achieve patterned-media disks with both higher areal bit density (greater than 1 Tbit/in$^2$) and a higher BAR (greater than 1, preferably equal to or greater than 2), a track pitch of about 50 nm and an island pitch of about 12.5 nm will be required, which would result in a BAR of 4. A master mold capable of nanoimprinting patterned-media disks with an island pitch of 12.5 nm is difficult to fabricate due to the limited resolution of e-beam lithography. Further increases in areal density will require even smaller and denser features. For example, an areal density of 5 Tb/in$^2$ with a BAR of 2 will require an island pitch along-the-track of 8 nm. The invention described in previously-cited application Ser. No. 12/604,333 relates to a method using directed self-assembly of block copolymers for making a master mold that is used to nanoimprint patterned-media disks with an island pitch (BP) difficult to achieve with the resolution of e-beam lithography, and with chevron servo patterns registered to the data tracks.

In this invention the method for making the master mold also uses directed self-assembly of block copolymers but results in a master mold without defects in the chevron servo pattern portion of the mold. The master mold may be used to directly nanoimprint the disks, but more likely is used to make replica molds which are then used to directly nanoimprint the disks. The method uses conventional or e-beam lithography to form a pattern of chemically modified polymer brush material on the master mold substrate that will result in the desired pattern of concentric rings for the data tracks and chevron pattern of slanted stripes for the servo sectors. The pattern includes interface strips between the sets of slanted stripes and at the transition regions between the concentric rings and the slanted stripes. It is the patterned interface strips that significantly reduce defects and control the extent of the disruptive areas in the servo patterns of the resulting nanoimprinted disks.

A first block copolymer material is deposited on the pattern. One of the components of the first block copolymer has an affinity for the chemically-modified polymer brush material, which results in directed self-assembly of the first block copolymer into lamallae perpendicular to the substrate and formed into alternating concentric rings and alternating slanted stripes of alternating first and second components of the first block copolymer. This component also forms on the chemically-modified polymer brush material on the interface strips, but as a lamella parallel to the substrate. The concentric rings are used to define the radial width of the islands formed by the master mold and the slanted stripes are used to define the cross-stripe width (SW) of the stripes of the chevron servo pattern formed by the master mold.

Directed self-assembly of a second block copolymer is then used to form a pattern of radial lines over the concentric rings and slanted stripes. One of the components of the first block copolymer and one of the components of the second copolymer are removed, leaving a grid of non-removed concentric rings, slanted stripes, radial lines and interface strips. This grid is used as an etch mask. Because one of the components of the first block copolymer has formed on the interface strips of chemically-modified polymer brush material, the resulting grid has significantly reduced defects in the regions between the sets of slanted stripes and in the transition regions between the concentric rings and slanted stripes. After etching and removal of the grid, the master mold has a pattern of either pillars or holes, depending on the method used. The pillars or holes are arranged in circular rings in the portions of the mold that will be used to form the data islands in the subsequently nanoimprinted disk. The rings are grouped into annular zones. The pillars or holes are arranged in slanted stripes in the portions of the mold that will be used to form the chevron servo sectors in the subsequently nanoimprinted disks. The radial spacing of the concentric rings is selected so that following the etching process the master mold has an array of pillars or holes with the desired BAR, which is greater than 1, preferably about 2 or greater. The method allows the stripes to be precisely registered with the concentric rings and because the rings and stripes are fabricated in the same step of directed self-assembly, the stripe pitch can be substantially the same as radial pitch of the concentric rings.

Self-assembling block copolymers have been proposed for creating periodic nanometer (nm) scale features. A self-assembling block copolymer typically contains two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of block copolymers that can be used for forming the self-assembled periodic patterns. If one of the components A or B is selectively removable without having to remove the other, then an orderly arranged structural units of the non-removed component can be formed. There are numerous references describing self-assembling block copolymers, including U.S. Pat. No. 7,347,953 B2; Kim et al., "Rapid Directed Self-Assembly of Lamellar Microdomains from a Block Copolymer Containing Hybrid", *Proc. of SPIE* Vol. 6921, 692129, (2008); Kim et al., "Device-Oriented Directed Self-Assembly of Lamella Microdomains from a Block Copolymer Containing Hybrid", *Proc. of SPIE* Vol. 6921, 69212B, (2008); and Kim et al., "Self-Aligned, Self-Assembled Organosilicate Line Patterns of ~20 nm Half-Pitch from Block Copolymer Mediated Self-Assembly", *Proc. of SPIE* Vol. 6519, 65191H, (2007).

Specific examples of suitable block copolymers that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-dymethylsiloxane) (PS-b-PDMS), Poly(Methylmethacrylate-b-(3-(3,5,7,9,11,13,15-Heptaisobutyl-Pentacyclo[9.5.1.1 3,91.5, 151.7,13]Ocasiloxane-1-Y10 Propyl Methacrylate) (PMMA-b-PMAPOSS) and Poly(styrene-b-lactide) (PS-b-PLA)

The specific self-assembled periodic patterns formed by the block copolymer are determined by the molecular volume ratio between the first and second polymeric block components A and B. When the ratio of the molecular volume of the second polymeric block component B over the molecular volume of the first polymeric block component A is less than about 80:20 but greater than about 60:40, the block copolymer will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the block copolymer will form alternating lamellae composed of the first and second polymeric block components A and B. In the present invention, the non-removed component is to be used as an etch mask, so ordered arrays of alternating lamellae and alternating cylinders are of interest.

The periodicity or bulk period ($L_0$) of the repeating structural units in the periodic pattern is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the block copolymer of the present invention, the bulk period ($L_0$) of the repeating structural units can be selected.

To form the self-assembled periodic patterns, the block copolymer is first dissolved in a suitable solvent system to form a block copolymer solution, which is then applied onto a surface to form a thin block copolymer layer, followed by annealing of the thin block copolymer layer, which causes phase separation between the different polymeric block components contained in the block copolymer. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), acetone, cyclohexane and chloroform. The block copolymer solution can be applied to the substrate surface by any suitable techniques, including, but not limited to: spin casting, coating, spraying, ink coating, dip coating, etc. Preferably, the block copolymer solution is spin cast onto the substrate surface to form a thin block copolymer layer. After application of the thin block copolymer layer onto the substrate surface, the entire substrate is annealed to effectuate microphase segregation of the different block components contained by the block copolymer, thereby forming the periodic patterns with repeating structural units.

The block copolymer films in the above-described techniques self-assemble without any direction or guidance. This undirected self-assembly results in patterns with defects so it is not practical for applications that require long-range ordering, such as for making annular zones of radial lines on a master mold for nanoimprinting patterned-media disks.

Lithographically patterned surfaces have been proposed to guide or direct the self-assembly of block copolymer domains. One approach uses interferometric lithography to achieve ordering of the domains with registration of the underlying chemical contrast pattern on the substrate. Lamellar and cylindrical domains may be formed on a substrate by this technique, as described in U.S. Pat. No. 6,746,825. However, interferometric lithography cannot be used to make annular zones of radial lines. US 2006/0134556 A1 describes techniques for creating a chemical contrast pattern to guide the self-assembly of block copolymers to form aperiodic patterns. Also, in both of these approaches to create chemical contrast patterns on the substrate to guide the self-assembly of block copolymers, the periodicity of the underlying chemical contrast pattern matches the bulk period $L_0$ of the block copolymer. For example, in US 2006/0134556 A1, $L_0$ is about 40 nm, so the lithographically-patterned substrate used to guide the self-assembly also has a period of about 40 nm, which can be achieved by conventional or e-beam lithography. However, it is difficult to use conventional or e-beam lithography to create a chemical contrast pattern for a block copolymer with $L_0$ between about 8 nm and 30 nm.

Figure 4:
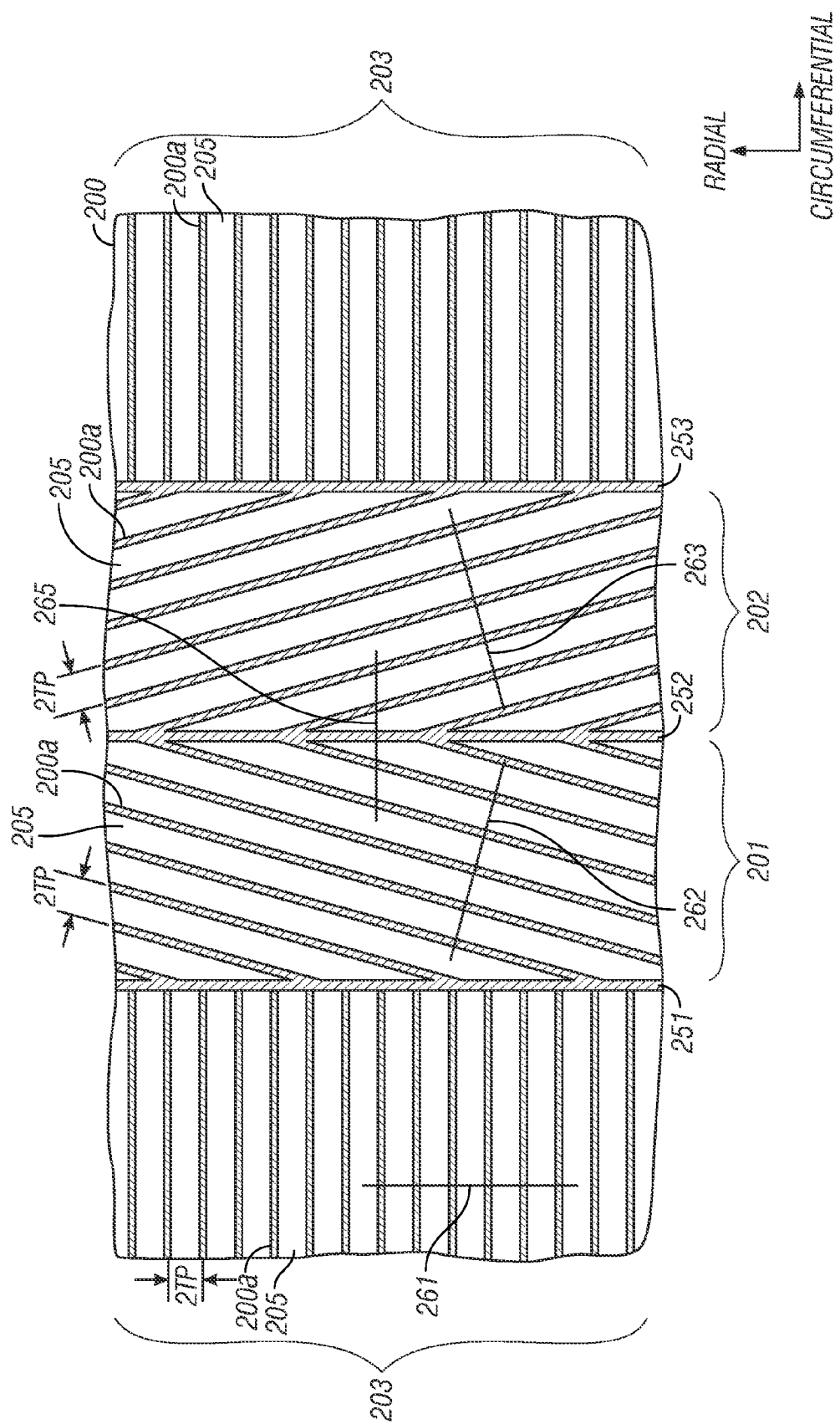
FIG. 4 is a top view of a portion of the master mold substrate after e-beam lithography has formed a chemically-modified neutral polymer brush material patterned into multiple sets of parallel bars and interface strips.

The method of this invention for making the master mold uses conventional optical, extreme ultraviolet (EUV), electron-beam (e-beam) or ion-beam lithography to form a chemically-modified neutral polymer brush material patterned into multiple sets of parallel bars and interface strips on a substrate. A top view of a portion of the substrate at this step in the method is shown in FIG. 4. The master mold substrate comprises a rigid base 200, which may be formed of any suitable material, such as, but not limited to, single-crystal Si, amorphous Si, silica, quartz, silicon nitride, carbon, tantalum, molybdenum, chromium, alumina and sapphire. The substrate may also be base 200 coated with one or more optional transfer layers to facilitate pattern transfer. The transfer layers may be any suitable material such as, but not limited to, silicon oxide, chromium, germanium, aluminum oxide, silicon nitride, tungsten, diamond-like carbon (DLC), molybdenum and tantalum. There could be any combination or any number of transfer layers on top of the same base 200. The substrate base 200 has formed on it at least two sets of parallel bars 200a of chemically-modified "neutral" material, like a polymer brush material, with an interface strip of neutral material between the two sets. FIG. 4 shows three sets, including a first set 201, a second set 202 and a third set 203. The white areas between the bars in FIG. 4 represent portions of the polymer brush material 205 that were protected by the resist and thus not chemically modified. Sets 201, 202 will be used to form, by directed self-assembly, the V-shaped or chevron pattern on the mold for forming the chevron servo patterns on the nanoimprinted disks. Set 203 will be used to form, by directed self-assembly, the concentric data tracks. Also formed on substrate 200 are interface strips 251, 252, 253 of chemically-modified neutral polymer brush material. The strips 251, 252, 253 between the circumferentially adjacent sets of stripes have been shown to control the extent of defects near the transition regions where the stripes undergo orientation changes during the subsequent directed self-assembly of the first block copolymer. The result, as will be shown later by a comparison of scanning electron microscopy (SEM) images, is a directed self-assembly with significantly reduced defects and control of the extent of the disruptive areas in the transition regions, particularly in the region of interface strip 252 between sets 201, 202 that are used to form the chevron servo pattern in the master mold. The interface strips 251, 252, 253 are depicted as generally straight continuous lines that are connected to bars 200a. However, depending on the shape and arrangement of the specific servo patterns and transition regions, the strips may be formed as discontinuous lines, like dashed lines with discrete strip segments, and/or may have irregular shapes, like curved segments.

Figure 5A:
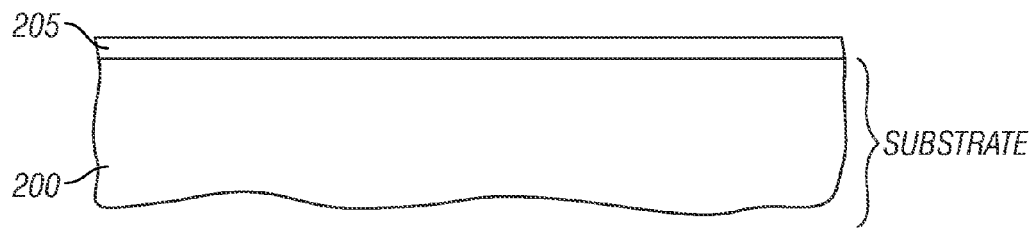
FIGS. 5A-5H are views at various stages of the fabrication method for making the master mold according to the present invention for use in nanoimprinting the disk shown in FIG. 2.
Figure 5B:
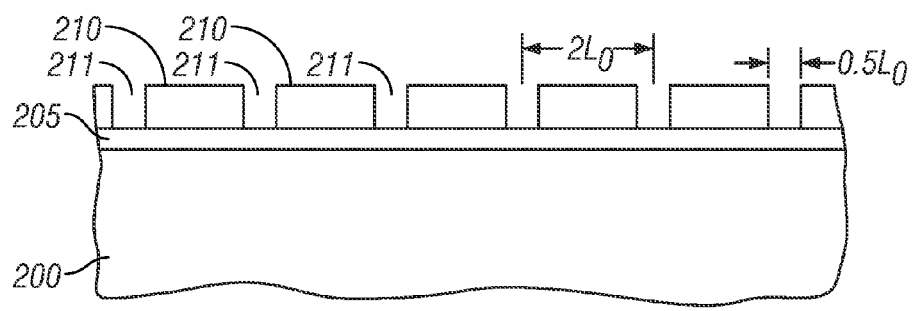
Figure 5C:
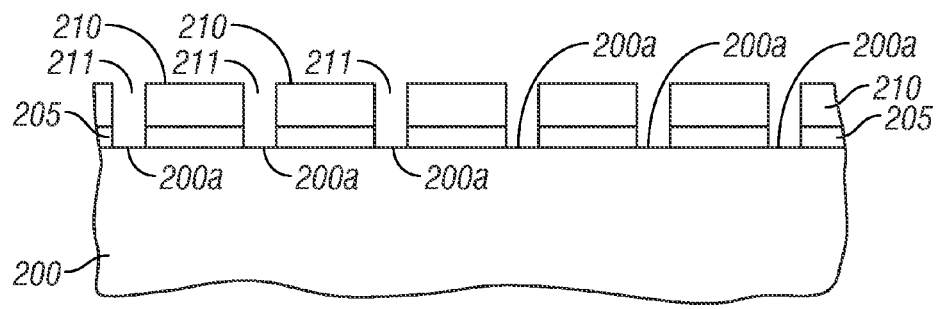
Figure 5D:
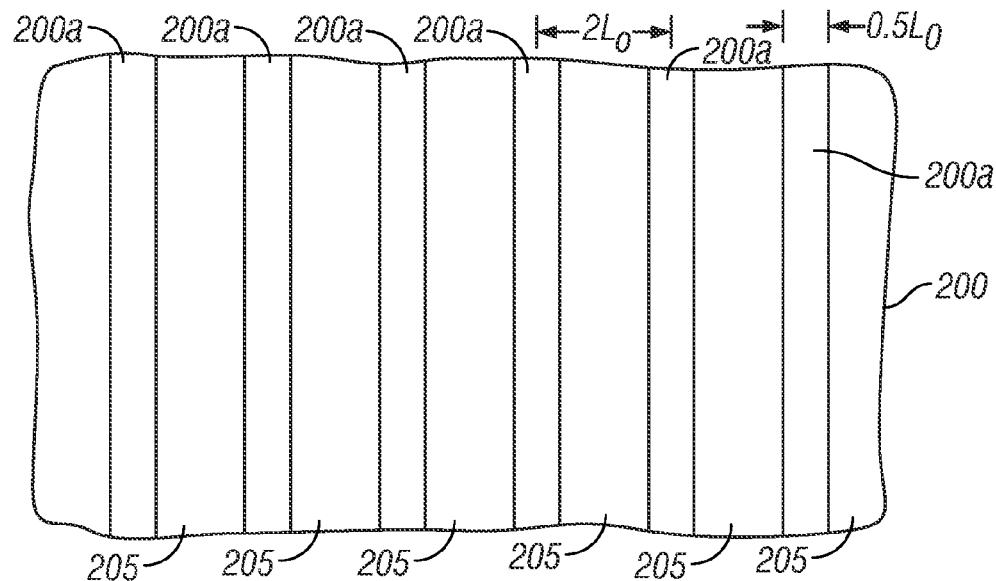
Figure 5E:
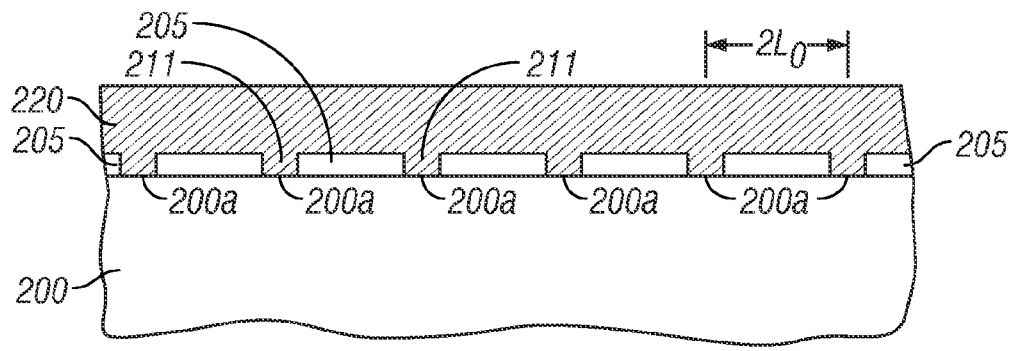
Figure 5F:
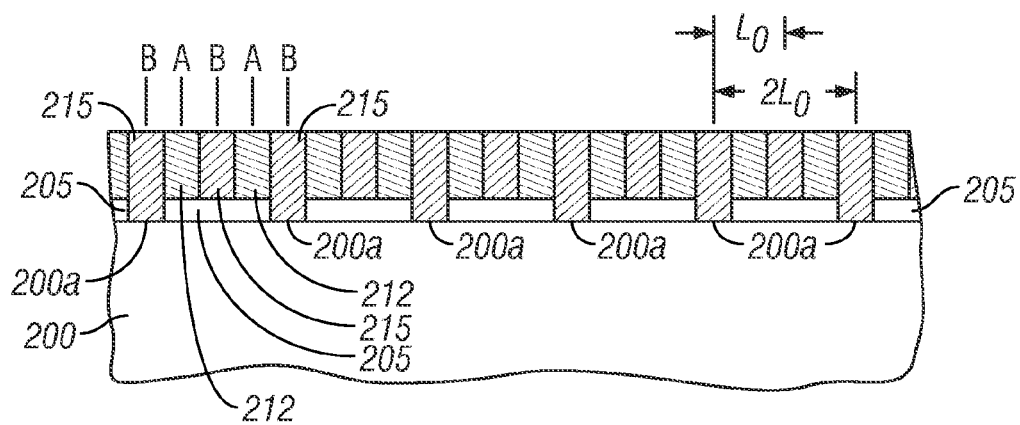
Figure 5G:
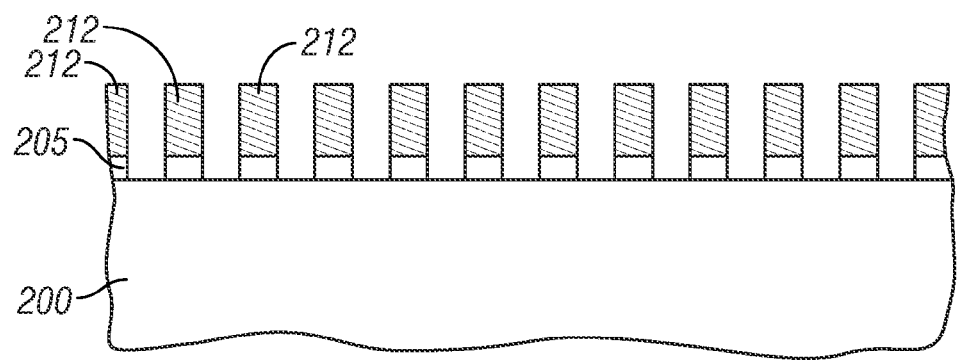
Figure 5H:
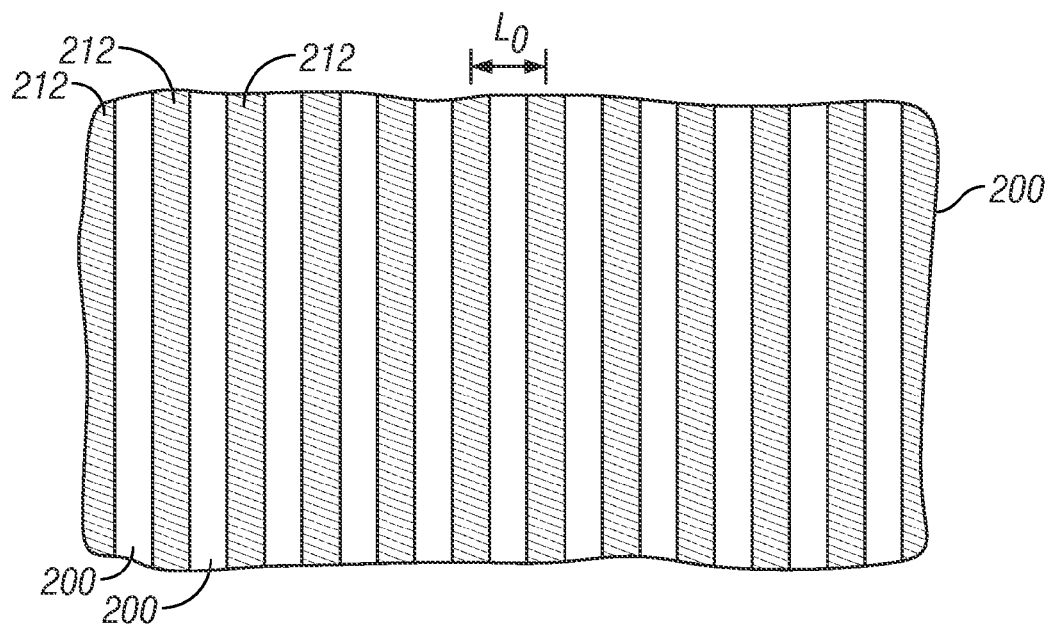

The method is explained with respect to FIGS. 5A-5H. FIGS. 5A-5C and 5E-5G are side sectional views, at various stages of the fabrication method, taken through a plane generally perpendicular to the parallel bars, for example along planes represented by lines 261, 262, 263 in FIG. 4. FIGS. 5D and 5H are top views at various stages of the method.

As shown in FIG. 5A a surface modification layer 205 of a material that does not show a strong wetting affinity by one of the polymer blocks over the other, that will be referred to as "neutral layer", is deposited onto the base 200. There may be one or more optional transfer layers (not shown) on the surface of base 200 below the surface modification layer 205. The neutral layer can be, but is not restricted to, a functionalized polymer brush, a cross-linkable polymer, a functionalized polymer "A" or "B" or a functionalized random copolymer "A-r-B" or a blend of "A" and "B", where "A" and "B" are the constituent block materials of the block copolymer. The functional group may be, for example, a hydroxyl group or a cross-linkable agent. In the present example, the neutral layer 205 is a hydroxyl-terminated polystyrene brush of lower molecular weight than the block copolymer used. The brush material is spin-coated on base 200 to a thickness of about 1-10 nm (below 6 nm is preferred). The purpose of the neutral layer is to tune the surface energy adequately to promote the desired domain orientation (perpendicular lamellae or parallel cylinders) and to provide the adequate wetting conditions for density multiplication.

In FIG. 5B a resist layer has been deposited on brush layer 205 and patterned into slices 210 of resist. The resist layer is patterned by e-beam and developed to form the pattern of slices 210 separated by spaces 211 that expose portions of brush layer 205. The e-beam tool patterns the resist layer so that the spaces 211 have a spacing that is approximately an integer multiple of $L_0$ (i.e., $nL_0$), the known bulk period for the selected block copolymer that will be subsequently deposited. As shown in FIG. 4, the spacing between the bars in sets 201, 202, 203 is selected to be $2L_0$, corresponding to twice the track pitch (TP). The width of each radial space 211 is selected to be approximately $0.5 L_0$.

In FIG. 5C, the structure is etched, by a process of oxygen plasma reactive ion etching ($O_2$ RIE), to remove portions of brush layer 205 in the radial spaces 211, which exposes portions 200a of base 200. Alternatively, the chemical structure of the exposed portions of brush layer 205 in the spaces 211 can be chemically altered (by oxygen plasma etching or other process such as reactive ion etching, neutral atom (such as Ar) or molecule milling, ion bombardment and photodegradation) so that the exposed portions 200a of brush layer 205 have a preferred affinity for one of the copolymers. In FIG. 5D, which is a top view, the resist 210 is removed, leaving on the substrate 200 a pattern of slices 205 of polymer brush material separated by bars 200a of base material (or chemically-altered brush material). In this pattern the bars 200a have a width of about 0.5 $L_0$ and a pitch of 2 $L_0$.

Next, in FIG. 5E, a layer 220 of first block copolymer material is deposited over the slices 205 of brush material and the bars 200a of base material (or chemically-altered brush material) in the spaces 211. The preferred first block copolymer material is the diblock copolymer polystyrene-block-polymethylmethacrylate (PS-b-PMMA) with $L_0$ between about 5 nm and 30 nm and is deposited by spin coating to a thickness of about 0.5 $L_0$ to 3 $L_0$.

In FIG. 5F, the first block copolymer layer has been annealed, for example by heating to about 200 deg. C. for approximately 60 minutes, which results in phase separation between the different components contained in the block copolymer. In this example, the B component (PMMA) has an affinity for the polar groups of the chemically altered brush 205 or for the exposed base 200 portions (bars 200a), and thus form as parallel stripes 215 on top of the bars 200a. Because the width of the bars 200 is approximately 0.5 $L_0$, the A component (PS) form in adjacent stripes 212 on the slices 205 of polymer brush material. As a result of this directed self-assembly of the A and B components this causes the B component to also form as stripes 215 on the centers of each slice 205 of polymer brush material. The bars 200a (or chemically altered brush) thus guide the self-assembly of the PS and PMMA components to form the alternating stripes 212, 215 in the structure as shown in FIG. 5F.

Next, in FIG. 5G, one of the components, the B component (PMMA), is selectively removed by a wet etch process (acetic acid, IPA or other selective solvent) or a dry etch process ($O_2$ RIE), leaving stripes 212 of the other component, the A component (PS). FIG. 5H is a top view of FIG. 5G and shows the A-component stripes 212 with a spacing $L_0$. In FIG. 5H the density of stripes 212 has been doubled from the density of bars 200a in FIG. 5D. Any residual material from layer 205 is also removed by the wet etch or dry etch process that removed the B component, leaving portions of the substrate surface 200 between the parallel stripes 212. The stripes 212 in FIGS. 5G-5H form a mask for subsequent etching of the substrate 200 to make the master mold with the desired patterns for nanoimprinting the disks.

FIG. 5G illustrates sectional views of planes along each of the lines 261, 262, 263 in FIG. 4 after the parallel stripes 212 have been formed by the above-described method. Thus FIG. 5H is a top view of any one of the portions shown by sets 201, 202 or 203 in FIG. 4 after the parallel stripes 212 have been formed by the above-described method.

Figure 6A:
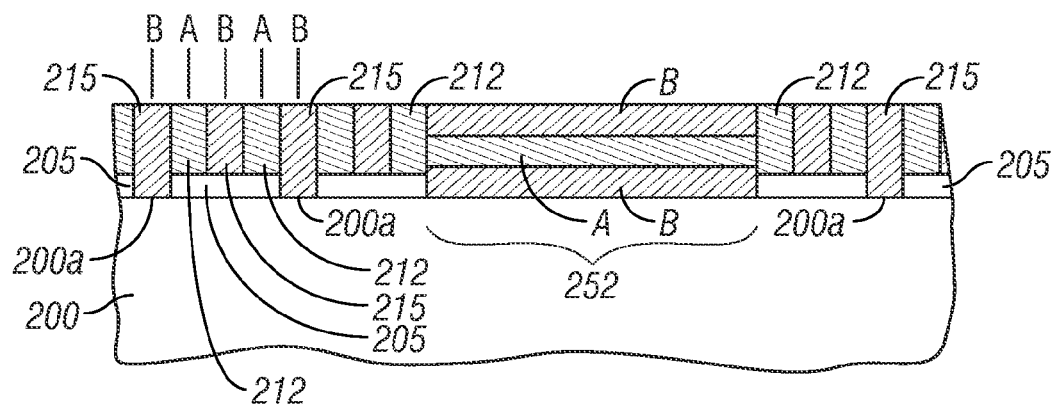
FIGS. 6A and 6B are sectional views at the points in the method corresponding to FIGS. 5F and 5G, respectively, for the purpose of showing how the interface strip in FIG. 4 affects the resulting structure of stripes in the transition region between sets of the parallel stripes in FIG. 4.
Figure 6B:
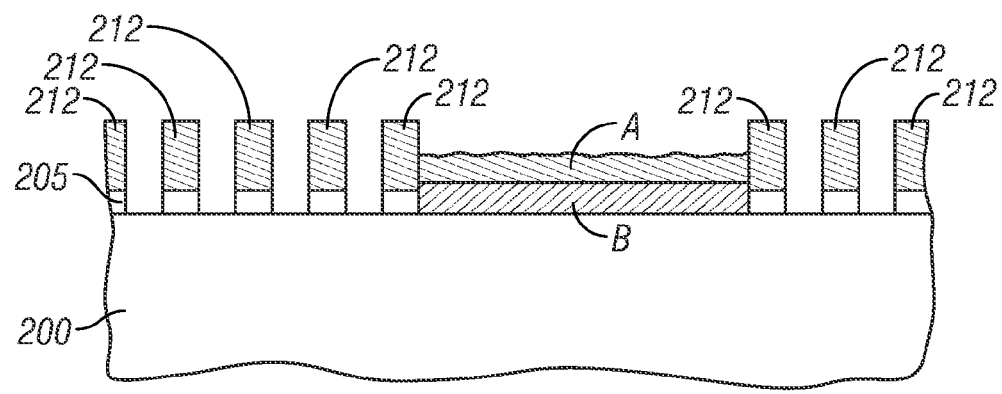

FIGS. 6A and 6B are sectional views at the points in the method corresponding to FIGS. 5F and 5G, respectively, but taken through a plane 264 (FIG. 4) for the purpose of showing how interface strip 252 affects the resulting structure of stripes 212 in the transition region between sets 201, 202 (FIG. 4). In the preferred embodiment the strip 252, which is either the exposed substrate or chemically-modified neutral polymer brush material, has an effective width greater than 0.5 $L_0$, preferably between 1 $L_0$ and 5 $L_0$. This results in the A and B components forming not as lamellae perpendicular to the substrate (as shown on the left side of FIG. 6A), but as lamellae parallel to the substrate. The layer or layers of component A material parallel to the substrate surface in the interface strip 252 will mask the B component material parallel to the substrate in the interface strip 252, and will also remain as part of the mask for subsequent etching of the substrate. This prevents the formation of defects at the transition regions in the etched substrate that becomes the master mold. This is because if the wet etch process is used for removal of the B component stripes 215 it will not dissolve the A component material, and if the dry etch process is used for removal of the B component stripes 215, the A component material in interface strip 252 will etch slower than the B component material. However, the strip 252 may alternatively have a width generally the same as the width of stripes 212, which would also substantially prevent defects because it would direct self-assembly of the components as lamellae perpendicular to the substrate in the transition region. FIG. 6B shows the resulting structure after removal of the B component at the regions where perpendicular lamellae formed (stripes 215), and depicts the remaining A component material where parallel lamellae were formed at the transition region (where strip 252 was present) so that substantially no defects will be formed in the master mold after etching using the A components as the etching mask.

Figure 7A:
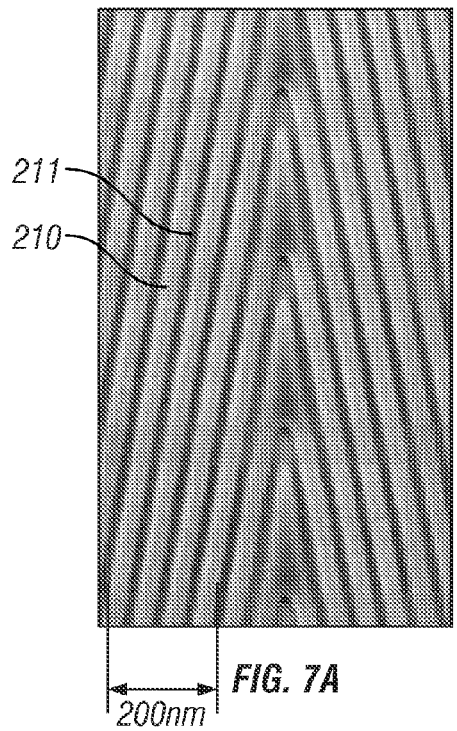
FIG. 7A is a scanning electron microscopy (SEM) top view of the structure at the point in the method corresponding to FIG. 5B and shows the patterned e-beam resist (lighter areas) with the two sets of parallel bars (darker areas) wherein the pattern does not include an interface strip between the two sets of parallel bars.
Figure 7B:
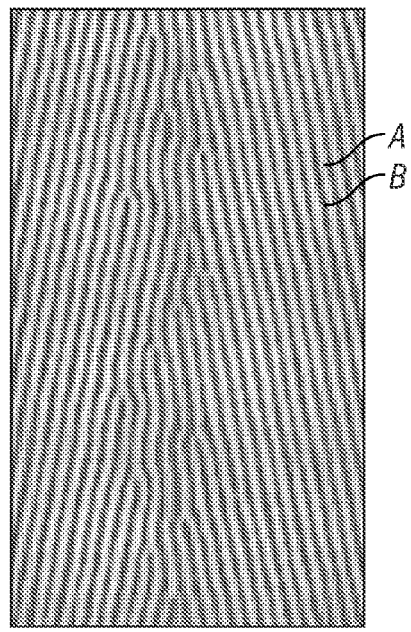
FIG. 7B is a SEM top view of the structure at the point in the method corresponding to FIG. 5F (after removal of the resist in FIG. 7A and deposition and directed self-assembly of the block copolymer) and shows the alternating stripes of the A components (lighter areas) and B components (darker areas).

FIGS. 7A-7B and FIGS. 8A-8B are SEM images that show the advantage of the method of the invention for minimizing defects in the transition regions between sets of parallel stripes in the completed master mold. FIG. 7A is a top view of the structure at the point in the method corresponding to FIG. 5B and shows the patterned e-beam resist (lighter areas) with the two sets of parallel bars (darker areas) wherein the pattern does not include an interface strip between the two sets of parallel bars. FIG. 7B is a top view of the structure at the point in the method corresponding to FIG. 5F (after removal of the resist in FIG. 7A and deposition and directed self-assembly of the block copolymer) and shows the alternating stripes of the A components (lighter areas) and B components (darker areas). FIG. 7B shows the typical dislocation defects that form near the transition region. Because the sharp angle at the apex of the chevron is not energetically favored by the self-assembly process, the block copolymer accommodates the polymer chains at the transition regions with these dislocation defects. These defect structures are randomly located with no predictable control over the extent of the defect areas away from the apex.

Figure 8A:
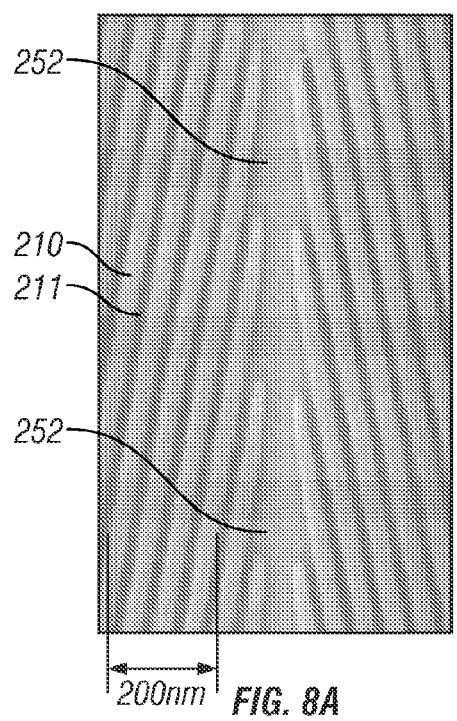
FIG. 8A is a SEM top view of the structure at the point in the method corresponding to FIG. 5B and shows the patterned e-beam resist (lighter areas) with the two sets of parallel bars (darker areas), but wherein the pattern includes an interface strip between the two sets of parallel bars.
Figure 8B:
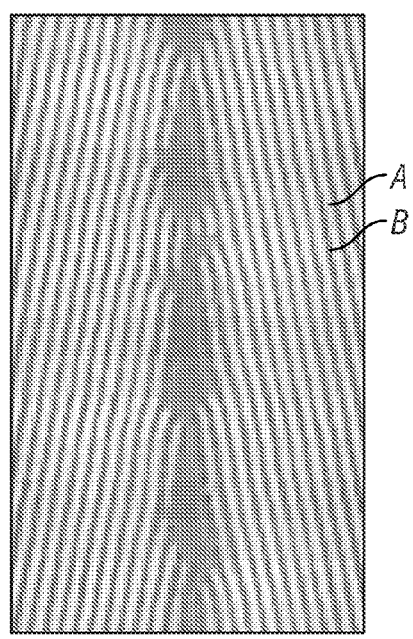
FIG. 8B is a SEM top view of the structure at the point in the method corresponding to FIG. 6A (after removal of the resist in FIG. 8A and deposition and directed self-assembly of the block copolymer) and shows the alternating stripes of the A components (lighter areas) and B components (darker areas).

By comparison, FIG. 8A is a top view of the structure at the point in the method corresponding to FIG. 5B and shows the patterned e-beam resist (lighter areas) with the two sets of parallel bars (darker areas), but wherein the pattern includes an interface strip 252 between the two sets of parallel bars. FIG. 8B is a top view of the structure at the point in the method corresponding to FIG. 6A (after removal of the resist in FIG. 8A and deposition and directed self-assembly of the block copolymer) and shows the alternating stripes of the A components (lighter areas) and B components (darker areas). FIG. 8B shows that there is a clear separation of the two sets of parallel stripes with minimal defects on the stripes near the transition region.

The method of the invention described above is sufficient to pattern the portions of the master mold that would form the chevron servo sector 120 and the horizontal data track separation lines (FIG. 2) of the nanoimprinted disk. However, it is necessary to pattern the master mold to also form the discrete data islands 30 in the data tracks 162 (FIG. 2). Thus, following the step shown in FIGS. 5G-5H, a pattern of generally radial lines is formed over the concentric rings that serve to define the data tracks. The radial lines are formed by the same method of directed self-assembly of a block copolymer as used for forming the sets of parallel stripes. Assuming that the stripes 212 in FIG. 5H depict the concentric rings for the data tracks, then a protective layer is deposited over the structure of FIG. 5H. The protective layer may be Si, SiO$_2$, alumina (Al$_2$O$_3$) or similar material sputter deposited to a thickness of approximately 1-2 nm. The purpose of the protective layer is to prevent movement and/or dissolving of the stripes 212 during subsequent processing. Then a surface modification or neutral layer, like neutral layer 205, is applied over the protective layer. Next, an e-beam resist film is applied over the surface modification layer and patterned into generally radial lines generally orthogonal to the stripes 212. The resist also covers the two sets of parallel stripes in the chevron servo region of the master mold. The structure is then etched, by a process of oxygen plasma reactive ion etching (O$_2$ RIE), to remove portions of the neutral layer. After removal of the resist a second block copolymer is deposited and annealed, which results in directed self assembly of alternating generally radial lines of A and B components of the second block copolymer. One of the components of the second block copolymer is then removed, leaving a pattern of unremoved components as radial lines on top of and aligned generally orthogonal to the stripes 212 in FIG. 5H. The result is a grid of unremoved components that serves as an etch mask during etching of the substrate.

Figure 9:
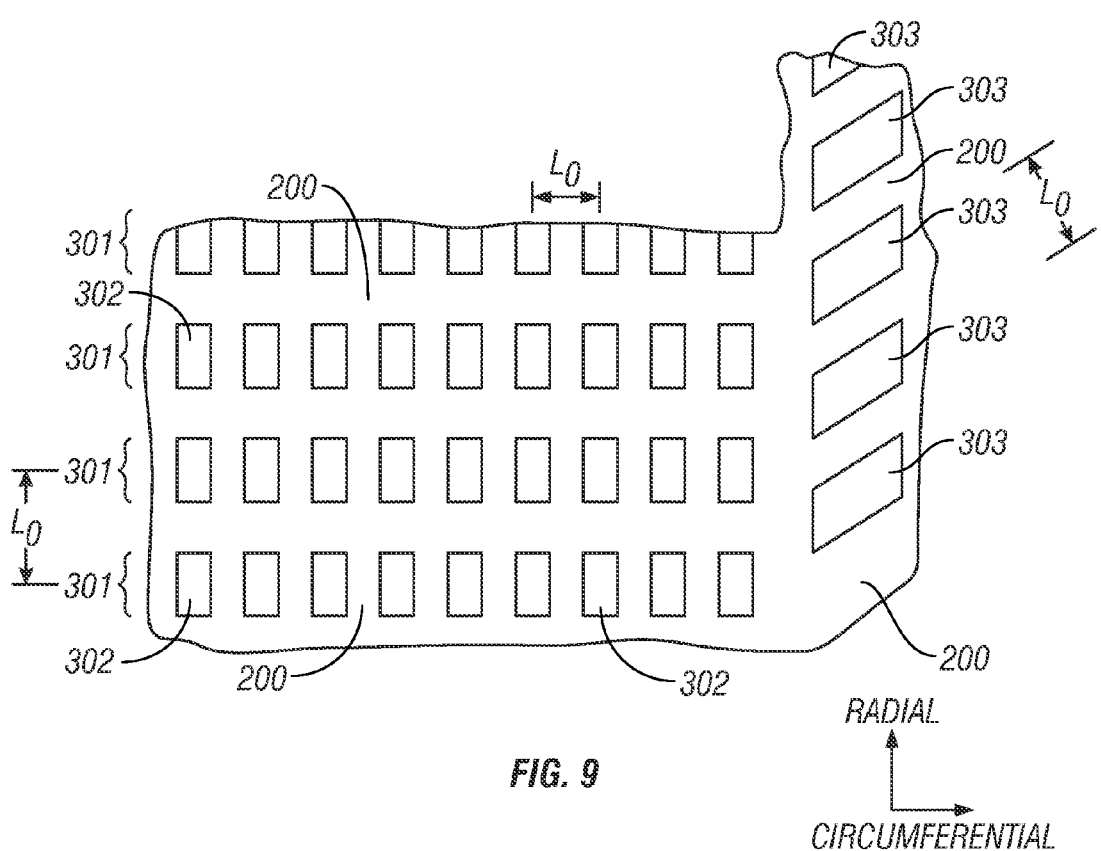
FIG. 9 is a top view of a portion of the resulting master mold with the substrate having concentric rings patterned with holes for the data islands and slanted recessed stripes for the chevron servo pattern in the disks to be nanoimprinted by the master mold.

Etching of the substrate through this mask, followed by removal of the remaining block copolymer material, results in a master mold with a pattern of recesses or holes arranged in circular rings, with the holes representing the discrete data islands in the nanoimprinted disks, and with parallel slanted recessed stripes, with the recessed stripes representing the chevron servo pattern in the nanoimprinted disks. FIG. 9 is a top view of a portion of the resulting master mold with substrate 200 having concentric rings 301 patterned with holes 302 for the data islands and slanted recessed stripes 303 for the chevron servo pattern. The structure of FIG. 9 can function as the master mold with the holes 302 and recessed stripes 303 functioning as the topographic pattern for nanoimprinting the disks. The circumferential pitch of the radial lines and thus the holes 302 is defined by the periodicity L$_0$ of the second block copolymer film, while the radial pitch of rings 301 and the stripe pitch of stripes 303 is defined by the periodicity L$_0$ of the first block copolymer. The first and second block copolymers may have the same or different values of L$_0$. The preferred second block copolymer material may also be the diblock copolymer polystyrene-block-polymethylmethacrylate (PS-b-PMMA). The characteristic bulk period, L$_0$, in a block copolymer is determined by its degree of polymerization, N, i.e., the number of constituent monomers in the polymer chain length. Block copolymers with different values of L$_0$ can be chosen by selecting the appropriate molecular weights. For example, a symmetric PS-b-PMMA with a total molecular weight of Mw=46 Kg/mol displays an L$_0$ of approximately 32 nm whereas one with Mw=36 Kg/mol exhibits an L$_0$ of approximately 27 nm. Other values for L$_0$ are known and described by Black, C. T., Ruiz, R., et al., "Polymer self assembly in semiconductor microelectronics", *IBM Journal of Research and Development*, Volume 51, Number 5, Page 605 (2007). In this method where the radial lines and the circumferential rings and slanted stripes are defined by directed self-assembly of block copolymers, the order of the fabrication process may be reversed, i.e., the radial lines may be defined first followed by the assembly of the concentric rings and slanted stripes.

Alternatively, the master mold can be made with use of one or more transfer layers on the substrate 200 below the surface modification layer 205 (FIG. 5A). This alternative method is described in application Ser. No. 12/141,062 filed Jun. 17, 2008 and assigned to the same assignee as this application. In the method using a transfer layer, after the formation of the first sets of stripes (e.g., the concentric rings for the data tracks and slanted stripes for the chevron servo pattern) and removal of B component material, the remaining stripes of A component material are used as a mask to transfer the pattern into the transfer layer, for example a DLC layer, by additive or subtractive lithography, i.e., by removing material such as by etching or by adding material such as by lift-off, plating or electroplating. Alternatively, in another additive process, the voids left by the B component can be filled back with a spin-on glass material. Once formed, the glass layer can be etched back to expose the original stripes of A component. A subsequent wet or dry process can be used to remove the A component, but not the new glass material that now remains in the locations once formed by the B component. The new glass material can be used as a mask to etch to the transfer layer or it can be left in place such that the second block copolymer layer is processed on top of the glass stripes. Once the pattern is transferred to the transfer layer, the remaining A component material is removed by a suitable wet or dry process. Subsequently, the second process (e.g., to form the generally radial lines for the individual data islands) is performed on the patterned transfer layer on the substrate 200. The second layer of neutral material is then deposited on top of the patterned transfer layer and the rest of the process continues as explained above.

In the method described above, the two block copolymer components are depicted as self-assembling into alternating lamellae. For the A and B components (PS and PMMA) to form as alternating lamellae the molecular volume ratio of the A to B components should be between about 40:60 and 60:40, preferably close to 50:50. However, it is also within the scope of the invention for the A component (PS) to form as cylinders within a matrix of the B component (PMMA). To achieve this type of structure, wherein the A component cylinders form lines or stripes 212 (FIG. 5F) within alternating lines or stripes 215 of B component material, the molecular volume ratio of component B over component A should be less than about 80:20 but greater than about 60:40, preferably close to 70:30.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making an imprinting master mold using directed self-assembly of a block copolymer having polymeric block components, the method comprising:
   providing a substrate;
   depositing on the substrate a layer of neutral material having no strong affinity for any component of said block copolymer;
   forming over the neutral material a resist pattern comprising a first set of parallel bands and a second set of parallel bands non-parallel to and spaced from said first set of bands;
   modifying the neutral material unprotected by the resist;
   removing the resist, leaving a pattern of modified neutral material comprising a first set of parallel bars, a second set of parallel bars non-parallel to and spaced from said first set of bars, and an interface strip between said first and second sets of bars, wherein the block copolymer has a bulk period $L_0$ and the interface strip has a width greater than $0.5L_0$ and less than $5L_0$;

depositing a layer of said block copolymer material and annealing the deposited block copolymer material to cause phase separation into a first set of parallel stripes of alternating first and second components and a second set of parallel stripes of alternating first and second components non-parallel to and spaced from said first set of stripes, the first component forming on said first and second sets of parallel bars as lamella perpendicular to the substrate surface and on said interface strip of modified neutral material as a lamella oriented parallel to the substrate surface; and removing one of said first and second components, leaving a first set of parallel stripes of the non-removed component and a second set of parallel stripes of the non-removed component non-parallel to and spaced from said first set of stripes of non-removed component.

2. The method of claim 1 wherein the interface strip is connected to the ends of the bars in the first and second sets of parallel bars.

3. The method of claim 1 wherein the interface strip is discontinuous with discrete segments.

4. The method of claim 1 wherein the block copolymer has a bulk period $L_0$ and wherein the parallel bars in said first set are spaced apart a distance $nL_o$ where n is an integer greater than or equal to 2.

5. The method of claim 4 wherein the parallel bars in said second set are spaced apart a distance equal to the spacing of the parallel bars in said first set.

6. The method of claim 1 wherein providing a substrate comprises providing a substrate formed of a material selected from single-crystal Si, amorphous Si, silica, quartz, silicon nitride, carbon, tantalum, molybdenum, chromium, alumina and sapphire.

7. The method of claim 1 wherein providing a substrate comprises providing a rigid substrate base having a transfer layer formed on it.

8. The method of claim 1 wherein the transfer layer is formed of a material selected from silicon oxide, chromium, germanium, aluminum oxide, silicon nitride, tungsten, diamond-like carbon (DLC), molybdenum and tantalum.

9. The method of claim 1 wherein the substrate has a center, and wherein the first set of parallel stripes of the non-removed component are slanted at an acute angle relative to a radius, the second set of parallel stripes of the non-removed component are slanted at said acute angle relative to a radius, and said first and second sets of stripes are slanted in different directions.

10. The method of claim 1 wherein the substrate has a center, and wherein the first set of parallel stripes of the non-removed component are slanted at an acute angle relative to a radius and the second set of parallel stripes of the non-removed component are generally concentric rings about said center.

11. The method of claim 10 further comprising:
forming a pattern of radial lines on the substrate;
etching the substrate, using said first set of stripes, said concentric rings and said radial lines as an etch mask; and
removing said first set of stripes, said concentric rings and said radial lines, leaving a substrate with a pattern of substrate material.

12. The method of claim 11 wherein the pattern of radial lines is formed on the substrate and said first set of stripes and said concentric rings are formed on the pattern of radial lines.

13. The method of claim 11 further comprising forming a protective layer on the radial lines and wherein depositing a layer of neutral material comprises depositing the neutral material directly on the protective layer.

14. The method of claim 1 wherein the block copolymer material is a copolymer of polystyrene (PS) and poly(methyl methacrylate) (PMMA).

15. A method for making a master mold for use in imprinting magnetic recording disks having chevron servo patterns using directed self-assembly of a block copolymer having polymeric block components, the method comprising:
providing a rigid substrate having a generally planar surface with a center;
depositing on the substrate surface a layer of neutral polymer brush material having no strong affinity for any component of said block copolymer;
forming over the neutral material a resist pattern comprising a first set of parallel bands slanted at an acute angle relative to a radial line from said substrate center and a second set of parallel bands, said second set of bands being non-parallel to and spaced from said first set of bands and slanted at said acute angle relative to a radial line from said substrate center;
modifying the neutral material unprotected by the resist;
removing the resist, leaving a pattern of modified neutral material comprising a first set of parallel bars, a second set of parallel bars non-parallel to and spaced from said first set of bars, and an interface strip between said first and second sets of bars;
depositing a layer of said block copolymer material and annealing the deposited block copolymer material to cause phase separation into a first set of parallel stripes of alternating first and second components and a second set of parallel stripes of alternating first and second components non-parallel to and spaced from said first set of stripes, the first component forming on said first and second sets of parallel bars of modified neutral material as lamellae perpendicular to the substrate surface and on said interface strip of modified neutral material as a lamella parallel to the substrate surface; and
removing the parallel stripes of second component, leaving a first set of parallel stripes of the first component, a second set of parallel stripes of the first component non-parallel to and spaced from said first set of stripes of first component, and the lamella of first component parallel to the substrate surface on said interface strip.

16. The method of claim 15 wherein the block copolymer has a bulk period $L_0$ and wherein the interface strip has a width greater than $0.5L_0$ and less than $5L_0$.

17. The method of claim 15 wherein the block copolymer has a bulk period $L_0$ and wherein the parallel bars in said first and second sets are spaced apart a distance $nL_0$ where n is an integer greater than or equal to 2.

18. The method of claim 15 further comprising etching the substrate, using as an etch mask said first and second sets of parallel stripes of the non-removed component and the lamella of first component parallel to the substrate surface on said interface strip.

19. The method of claim 15 wherein providing a substrate comprises providing a rigid substrate base having a transfer layer formed on it.

20. The method of claim 19 wherein the transfer layer is formed of a material selected from silicon oxide, chromium, germanium, aluminum oxide, silicon nitride, tungsten, diamond-like carbon (DLC), molybdenum and tantalum.

* * * * *

UNITED STATES PATENT AND TRADEMARK OFFICE
CERTIFICATE OF CORRECTION

Page 1 of 1

PATENT NO. : 8,815,105 B2
APPLICATION NO. : 13/036346
DATED : August 26, 2014
INVENTOR(S) : Dobisz et al.

It is certified that error appears in the above-identified patent and that said Letters Patent is hereby corrected as shown below:

In the Claims

Column 17, line 39, Claim 8 delete "1" and replace with --7--.

Signed and Sealed this
Third Day of February, 2015

Michelle K. Lee
*Deputy Director of the United States Patent and Trademark Office*